March 16, 1965

G. L. CLAPPER 3,174,055

PULSE SHAPER AND DIFFERENTIATOR

Filed Nov. 3, 1960

2 Sheets-Sheet 1

INVENTOR
GENUNG L. CLAPPER

BY G. R. Gugger
AGENT

United States Patent Office 3,174,055
Patented Mar. 16, 1965

3,174,055

PULSE SHAPER AND DIFFERENTIATOR

Genung L. Clapper, Vestal, N.Y., assignor to International Business Machines Corporation, New York, N.Y., a corporation of New York Filed Nov. 3, 1960, Ser. No. 67,058
4 Claims. (Cl. 307—88.5)

This invention relates to a circuit for producing an output waveform from the leading or trailing edge of a square wave and, more specifically, to a pulse shaping and differentiating circuit which utilizes an energy storage device as an effective clamp for recovery purposes.

The prior art up to now teaches the use of a conventional diode clamped R-C differentiator circuit with a transistor amplifier for pulse shaping. And it is well known that, in this conventional clamped differentiator approach, at high pulse repetition rates, or when differentiating the trailing edge of short pulses the time for diode recovery is so short (for example, 70 millimicroseconds) that a large amount of the input power is lost in the diode. All of the positive transient and most of the negative transient perform no function except to "heat up" the lossy diode which only makes the circuit more inefficient as the temperature rises. The small amount of input power left to operate the transistor produces a weak pulse with no driving capabilities.

It has been found that the above disadvantages of the conventional diode clamped differentiator approach may be overcome by the present novel circuit wherein the clamp diode is replaced by an inductor with a value such that the series resonant frequency is higher than the input frequency. As a result, there is provided an entirely new differentiating and pulse forming action. The energy in the positive-going input waveform is not dissipated but rather is stored in the magnetic field of the inductor. As the field collapses, energy is added to the negative input transient so that the transistor is strongly driven into saturation and a full output is produced. As the input drives negatively, a magnetic field is built up in the opposite direction that shapes up the output waveform when it collapses and also restores the level of the circuit just before a new pulse appears at the input.

Accordingly, a principle object of the present invention is to provide a new and improved pulse shaping and differentiating circuit having unusually good recovery characteristics.

Another object of the present invention is to provide a new and improved pulse shaping and differentiating circuit which utilizes an energy storage device as an effective clamp for recovery purposes without entailing the losses usually associated with fast recovery circuit.

A still further object of the present invention is to provide a pulse shaping and differentiator circuit wherein the conventional clamp diode is replaced by an inductor with a value such that the series resonant frequency is higher than the input frequency.

The foregoing and other objects, features and advantages of the invention will be apparent from the following more particular description of a preferred embodiment of the invention, as illustrated in the accompanying drawings.

Figure 1:
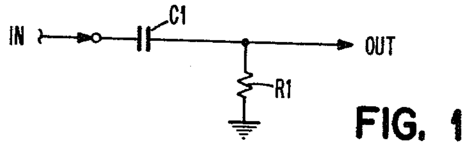
FIG. 1 is a schematic diagram of a conventional R-C differentiating circuit.
Figure 2:
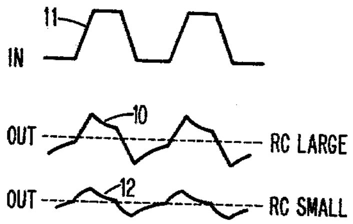
FIG. 2 is a diagram of waveforms illustrating the operation of the circuit shown in FIG. 1.

Referring to FIG. 1, there is shown a conventional R-C differentiating circuit comprising the capacitor C1 and resistor R1. If the time constant (R-C product) is relatively large, a waveform 10 is produced, as shown in FIG. 2, in response to the input waveform 11. This demonstrates the poor recovery characteristics of this circuit. Reducing the time constant will permit better recovery, but the amplitude of the output 12 will be reduced. There has been assembled a finite rise time for the input which is representative of the usual case.

Figure 3:
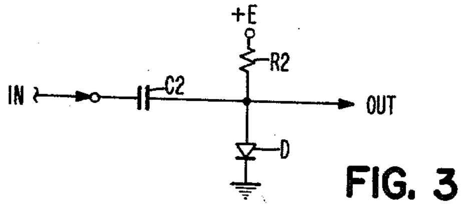
FIG. 3 is a schematic diagram of a conventional clamped R-C differentiating circuit.
Figure 4:
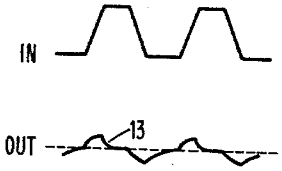
FIG. 4 is a diagram of waveforms illustrating the operation of the circuit shown in FIG. 3.

A clamp R-C differentiating circuit, as shown in FIG. 3, provides somewhat better recovery by limiting the voltage excursion of the output in one direction. This circuit comprises the capacitor C2 and resistor R2 and utilizes a diode D for the limiting function. The diode D assumes a low resistance when current flows in a forward direction, that is from the positive voltage source E, through the resistance R2 and diode D to ground. The rising waveform of the input is suppressed, as shown by the waveform 13 in FIG. 4, because the output is effectively shorted to ground through the low impedance of the conducting diode. The negative-going input waveform appears at the output since the diode is reverse biased by the negative transient. In most diodes, a finite time is needed to recover the normal high resistance of the reverse-biased state. For high frequency circuits, this presents a problem of loading because of the limited diode recovery time available.

Figure 5:
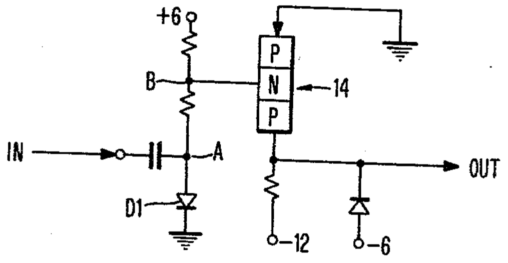
FIG. 5 is a schematic diagram of a conventional clamped R-C differentiator with a transistor amplifier for pulse shaping.
Figure 6:
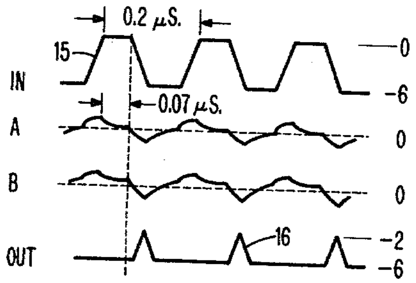
FIG. 6 is a diagram of waveforms illustrating the operation of a circuit shown in FIG. 5.

A conventional clamped R-C differentiator with a transistor amplifier 14 for pulse shaping is shown in FIG. 5. The input waveform 15 (FIG. 6) to the circuit may be the output of a 5.0 megacycle square wave oscillator with a period of 0.2 microsecond. It is evident that less than 0.1 microsecond is available for the recovery of the diode D1. A large amount of the input power is lost in the diode D1 and all of the positive transient and most of the negative transient perform no function but to heat up the lossy diode, making the circuit more inefficient as the temperature rises. The diode D1 loads the input on both the positive and negative transients, and the small amount of input power left to operate transistor 14 produces a weak pulse 16 (FIG. 6) with no driving capabilities.

Figure 7:
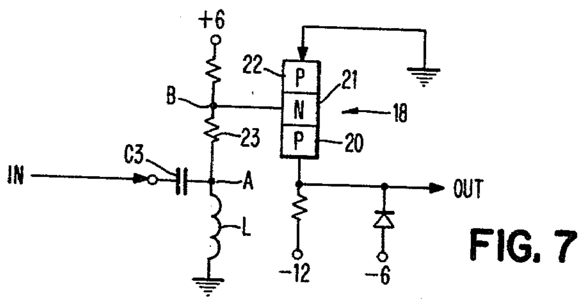
FIG. 7 is a schematic diagram of an energy conserving pulse shaper and differentiator embodying the principles of the present invention.
Figure 8:
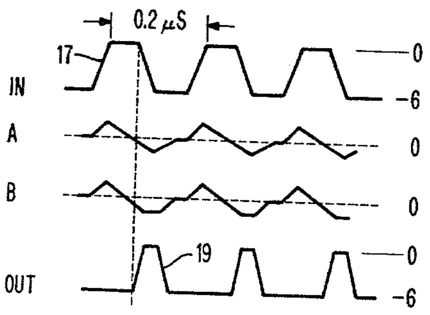
FIG. 8 is a diagram of waveforms illustrating the operation of the circuit shown in FIG. 7.

The energy-conserving pulse shaper and differentiator circuit embodying the principles of the present invention is shown in FIG. 7. The essential feature of the circuit is the efficient use of energy to provide a shaped differentiated pulse from,, for example, a 5.0 megacycle square wave input. The circuit is the same as the conventional one shown in FIG. 5 except that the clamp diode D1 has been replaced by an indutor L. The value of this inductance is so chosen that the reasonant frequency of the L-C series formed by the inductor L and the input capacitor C3 is slightly higher than the maximum input frequency. For example, if it is desired to differentiate a pulse source nominally 5 megacycles with a possible variation of from 4 to 6 megacycles, then a frequency of approximately 7 megacycles would be chosen for the series resonant frequency. This circuit produces an entirely new differentiating and pulse forming action. The energy in the positive-going input waveform 17 (FIG. 8) is not dissipated but is stored in the magnetic field of the inductor as current flows from point A through the inductor to ground. As the field collapses, the stored energy in the inductor is added to the energy of the negative input transient to produce a strong "turn on" conduction current in the transistor 18 so that the transistor is strongly driven into saturation and a full well-shaped output pulse 19 (FIG. 8) is produced at the collector electrode 20. Much of this stored energy is now dissipated in the base 21 and emitter 22 circuit of the transistor and in the base resistor 23. This provides a desirable damping action which prevents spurious ringing. As the input drives point A negatively, a magnetic field is built up in the opposite direction that aids in turning off the transistor as it collapses and quickly restores points A and B to the normal D.C. levels of ground and 0.2 volts, respectively. A better clamping action is obtained than with the diode because the voltage at point A is restored to the 0 volt reference level by the time that the negative transient is about to begin. The transistor is now cut off and the differentiation circuit is completely restored. The energy abstracted from the input has been efficiently used to create a short well-shaped pulse at the trailing edge of the input pulse.

The present circuit has excellent usage as a sync driver for a high speed shift register, in high speed timing rings, and wherever high speed differentiation is needed. The circuit also provides a number of beneficial actions such as (*a*) light loading of the input, (*b*) efficient energy transfer, (*c*) good recovery characteristics, (*d*) a full output with good driving capabilities, and (*e*) no phase shift in the output waveform since the stored energy from the rising input waveform is applied just before the negative input transient begins so that normal delays in the circuit are compensated.

While the invention has been particularly shown and described with reference to a preferred embodiment thereof, it will be understood by those skilled in the art that various changes in form and details may be made therein without departing from the spirit and scope of the invention.

What is claimed is:

1. A pulse shaping and differentiating circuit comprising:
   - a transistor amplifier having emitter, base and collector electrodes;
   - a source of voltage;
   - a biasing circuit connected between said voltage source and the base electrode of said transistor for normally biasing said transistor off;
   - a source of input voltage pulses;
   - a source of return voltage; and
   - a series resonant circuit including a capacitor having one side connected to the source of voltage pulses and an inductor having one side connected to the source of return voltage and the junction between the capacitor and the inductor connected to the bias circuit and to the base electrode and resonant at a frequency slightly higher than the maximum frequency of the input pulses to store energy from the leading edge of each input pulse in the inductor and to add the energy remaining in the inductor to the energy from the trailing edge of each input pulse to effect a strong turn on of the transistor amplifier, thereby to produce a well-shaped output pulse.

2. A pulse shaping and differentiating circuit comprising:
   - a transistor amplifier having emitter, base and collector electrodes;
   - a source of voltage;
   - a biasing circuit connected between said voltage source and the base electrode of said transistor for normally biasing said transistor off;
   - a source of input voltage pulses;
   - a source of return voltage; and
   - a series resonant circuit including a capacitor having one side connected to the source of voltage pulses and an inductor having one side connected to the source of return voltage and the junction between the capacitor and the inductor connected to the bias circuit and to the base electrode and resonant at a frequency slightly higher than the maximum frequency of the input pulses to store energy from one edge of each input pulse in the inductor and to add the energy remaining in the inductor to the energy from the other edge of each input pulse to effect a strong turn on of the transistor amplifier, thereby to produce a well-shaped output pulse.

3. A pulse shaping and differentiating circuit comprising:
   - a transistor amplifier having emitter, base and collector electrode;
   - a source of voltage;
   - a biasing circuit including a pair of series connected resistors, one resistor being connected to said voltage source and the junction between the resistors being connected to the base electrode of said transistor for normally biasing said transistor off;
   - a source of input voltage pulses;
   - a source of return voltage;
   - a series resonant circuit including a capacitor having one side connected to the source of voltage pulses and an inductor having one side connected to the source of return voltage and the junction between the capacitor and the inductor connected to the other resistor and resonant at a frequency slightly higher than the maximum frequency of the input pulses to store energy from the leading edge of each input pulse in the inductor and to add the energy remaining in the inductor to the energy from the trailing edge of each input pulse to effect a strong turn on the transistor amplifier, thereby to produce a well-shaped output pulse.

4. A pulse shaping and differentiating circuit comprising:
   - a transistor amplifier having emitter, base and collector electrodes;
   - a source of voltage;
   - a biasing circuit connected between said voltage source and the base electrode of said transistor for normally biasing said transistor off;
   - a source of input voltage pulses;
   - a source of return voltage; and
   - a series resonant circuit including a capacitor having one side connected to the source of voltage pulses and an inductor having one side connected to the source of return voltage and the junction between the capacitor and the inductor connected to the bias circuit and to the base electrode and resonant at a frequency slightly higher than the maximum frequency of the input pulses to store energy from the leading edge of each input pulse in the inductor and to add the energy remaining in the inductor to the energy from the trailing edge of each input pulse to effect a strong turn on the transistor amplifier, the trailing edge of each input pulse building up in the inductor a magnetic field in the opposite direction which, when it collapses, effects turn off of the transistor prior to the next input pulse, thereby producing a well-shaped output pulse.

References Cited in the file of this patent

UNITED STATES PATENTS 2,891,172 Bruce et al. ............ June 16, 1959
2,981,852 MacLean et al. ............ Apr. 25, 1961

2,985,769 Blount ............ May 23, 1961
3,038,128 Fischman et al. ............ June 5, 1962
3,068,366 Brunschweiger ............ Dec 11, 1962

OTHER REFERENCES

Article: "Using Inductive Control in Computer Circuits," by William Carey, Electronics September 18, 1959, pages 31 to 33.